United States Patent
Yu et al.

(10) Patent No.: US 12,503,640 B2
(45) Date of Patent: Dec. 23, 2025

(54) QUANTUM DOT, AND INK COMPOSITION, OPTICAL MEMBER AND ELECTRONIC DEVICE INCLUDING THE SAME

(71) Applicant: Samsung Display Co., Ltd., Yongin-si (KR)

(72) Inventors: Sanghee Yu, Yongin-si (KR); Kawon Pak, Yongin-si (KR); Seunghee Jang, Yongin-si (KR); Kyungsig Lee, Yongin-si (KR); Taekjoon Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 897 days.

(21) Appl. No.: 17/648,346

(22) Filed: Jan. 19, 2022

(65) Prior Publication Data
US 2022/0228055 A1    Jul. 21, 2022

(30) Foreign Application Priority Data

Jan. 20, 2021  (KR) .................. 10-2021-0008260
Aug. 13, 2021  (KR) .................. 10-2021-0107537

(51) Int. Cl.
| | | |
|---|---|---|
| C09K 11/02 | (2006.01) | |
| C09D 11/037 | (2014.01) | |
| C09D 11/50 | (2014.01) | |
| C09K 11/08 | (2006.01) | |
| C09K 11/88 | (2006.01) | |
| H10K 50/115 | (2023.01) | |

(Continued)

(52) U.S. Cl.
CPC .......... *C09K 11/025* (2013.01); *C09D 11/037* (2013.01); *C09D 11/50* (2013.01); *C09K 11/0883* (2013.01); *C09K 11/883* (2013.01); *H10K 50/115* (2023.02); *B82Y 20/00* (2013.01); *B82Y 40/00* (2013.01)

(58) Field of Classification Search
CPC ...... H10K 50/115; H10K 59/38; H10K 50/85; H10K 59/875; H10H 20/0361; C09D 11/037; C09D 11/50; C09K 11/025; C09K 11/0883; C09K 11/703; C09K 11/883; B82Y 20/00
See application file for complete search history.

(56) References Cited

U.S. PATENT DOCUMENTS

| | | |
|---|---|---|
| 10,246,634 B2 | 4/2019 | Yang et al. |
| 10,961,446 B2 | 3/2021 | Kim et al. |
| 10,988,685 B2 | 4/2021 | Ahn et al. |

(Continued)

FOREIGN PATENT DOCUMENTS

| | | |
|---|---|---|
| CN | 108110144 A | 6/2018 |
| CN | 108441221 A | 8/2018 |

(Continued)

*Primary Examiner* — Brook Kebede
(74) *Attorney, Agent, or Firm* — Womble Bond Dickinson (US) LLP

(57) ABSTRACT

Provided are a quantum dot including a core including crystals of a first semiconductor; a shell located on the core and including crystals of at least one second semiconductor; a first region located on the shell and including a first ligand; and an outerlayer located on the first region and an oligomer and/or polymer including a metal and a polar organic group, and an ink composition, an electronic device, and an optical member including the quantum dot.

20 Claims, 3 Drawing Sheets

(51) Int. Cl.
    *B82Y 20/00*           (2011.01)
    *B82Y 40/00*           (2011.01)

(56)           References Cited

U.S. PATENT DOCUMENTS

| | | |
|---|---|---|
| 11,053,436 B2 | 7/2021 | Naasani |
| 2013/0190493 A1 | 7/2013 | Naasani |
| 2017/0158954 A1 | 6/2017 | Yang et al. |
| 2017/0373232 A1* | 12/2017 | Kan .................... H10H 20/855 |
| 2018/0102449 A1 | 4/2018 | Pschenitzka et al. |
| 2018/0148638 A1 | 5/2018 | Ahn et al. |
| 2018/0151817 A1 | 5/2018 | Cho et al. |
| 2019/0257003 A1* | 8/2019 | Kim .................... H10K 50/115 |
| 2019/0276734 A1 | 9/2019 | Kim et al. |
| 2020/0172806 A1 | 6/2020 | Park et al. |
| 2021/0024820 A1 | 1/2021 | Choi et al. |

FOREIGN PATENT DOCUMENTS

| | | |
|---|---|---|
| CN | 109803925 A | 5/2019 |
| KR | 10-2017-0048220 A | 5/2017 |
| KR | 10-2017-0064164 A | 6/2017 |
| KR | 10-2018-0059363 A | 6/2018 |
| KR | 10-2018-0059724 A | 6/2018 |
| KR | 10-1909541 B1 | 10/2018 |
| KR | 10-2019-0106819 A | 9/2019 |
| KR | 10-2086729 B1 | 3/2020 |

\* cited by examiner

QUANTUM DOT, AND INK COMPOSITION, OPTICAL MEMBER AND ELECTRONIC DEVICE INCLUDING THE SAME

CROSS-REFERENCE TO RELATED APPLICATIONS

This application claims priority to Korean Patent Application Nos. 10-2021-0008260, filed on Jan. 20, 2021, and 10-2021-0107537, filed on Aug. 13, 2021, in the Korean Intellectual Property Office, the entire contents of which are hereby incorporated by reference.

BACKGROUND

1. Field

One or more embodiments of the present disclosure relate to quantum dots, and ink compositions, optical members, and electronic devices including the same.

2. Description of the Related Art

Quantum dots, as nanocrystals of semiconductor materials, are materials that exhibit quantum confinement effects. When the quantum dots reach an energy excited state upon receiving light from an excitation source, they emit energy corresponding to their own band gaps. In this case, because wavelengths of the same material may vary according to particle size, light having a suitable or desired wavelength may be obtained by adjusting the size of quantum dots and thus quantum dots may be applied to various suitable devices due to properties such as excellent color purity and high light emission efficiency.

Also, among optical members, quantum dots may be used as materials that perform various suitable optical functions (e.g., light conversion function). Quantum dots, which are semiconductor nanocrystals a few nanometers in size, may have different energy bandgaps by adjusting size and composition of the nanocrystals, thereby emitting light having various suitable wavelengths.

An optical member including such quantum dots may have a thin-film shape, e.g., a thin-film shape patterned for each sub-pixel. Such an optical member may be used as a color conversion member of a device including various suitable light sources.

SUMMARY

One or more embodiments of the present disclosure include quantum dots having excellent dispersity in a polar solvent and increased efficiency without detachment of a non-polar ligand from the quantum dots surface-coordinated with the non-polar ligand, and ink compositions, optical members, and electronic devices including the same.

Additional aspects of embodiments will be set forth in part in the description which follows and, in part, will be apparent from the description, or may be learned by practice of the presented embodiments of the disclosure.

According to one or more embodiments, a quantum dot includes a core comprising crystals of a first semiconductor, a shell located on the core and comprising crystals of at least one second semiconductor, a first region located on the shell and comprising a first ligand, and an outerlayer located on the first region and an oligomer and/or polymer including a metal and a polar organic group.

According to one or more embodiments, an ink composition includes the quantum dot.

According to one or more embodiments, an optical member includes the quantum dot.

According to one or more embodiments, an electronic device includes a first electrode, a second electrode facing the first electrode, an intermediate layer interposed between the first electrode and the second electrode, and a color conversion member provided to an exterior of one or more selected from the first electrode and the second electrode facing the intermediate layer, wherein the color conversion member includes the quantum dot.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
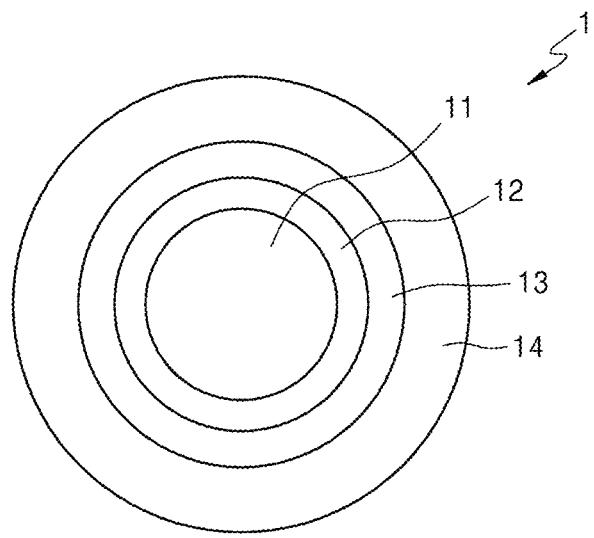
FIG. 1 is a schematic cross-sectional view of a quantum dot according to an embodiment of the present disclosure.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of embodiments of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure below allows for various changes and numerous embodiments, particular embodiments will be illustrated in the drawings and described in more detail in the written description. Effects and features of the present disclosure and a method of achieving the effects and features will be apparent by referring to embodiments described below in connection with the accompanying drawings. However, the subject matter of the present disclosure is not restricted by these embodiments but can be implemented in many different forms.

Hereinafter, embodiments of the present disclosure will be described in more detail with reference to the accompanying drawings. In the drawings, like reference numerals denote like elements or components having substantially same functions, and duplicate descriptions will not be repeated.

In the following embodiments, terms "first," "second," etc. are used to distinguish one component from other components and, therefore, the components are not limited by the terms.

An expression used in the singular encompasses the expression of the plural unless it has a clearly different meaning in the context.

In the following embodiments, it is to be understood that the terms "include" or "have" are intended to indicate the existence of elements disclosed in the specification, and are not intended to preclude the possibility that one or more other elements may exist or may be added.

In the following embodiments, it will be understood that when one element such as layer, film, region, or plate, is referred to as being "on" another element, it may be directly on the other element, or intervening elements may also be present therebetween. Also, sizes of elements in the drawings may be exaggerated or reduced for convenience of explanation. For example, because sizes and thicknesses of components in the drawings may be arbitrarily illustrated for convenience of explanation, the following embodiments are not limited thereto.

Quantum Dot

FIG. 1 is a schematic cross-sectional view of a structure of a quantum dot according to an embodiment of the present disclosure.

Referring to FIG. 1, a quantum dot 1 includes: a core 11 including crystals of a first semiconductor; a shell 12 located on the core and including crystals of at least one second semiconductor; a first region 13 located on the shell and including a first ligand; and an outerlayer 14 located on the first region and including a polymer and/or oligomer including a metal and a polar organic group.

Because the quantum dot has a core/shell structure including semiconductor crystals, the first region including a non-polar ligand is located on the surface of the shell, and the outerlayer is located on the first region to surround the first region and includes a polymer and/or oligomer of a monomer represented by Formula 1 below, loss of a semiconductor metal and detachment of the first ligand may be prevented or reduced, thereby inhibiting or reducing deterioration of the quantum dot.

In addition, because the quantum dot includes the outerlayer including a polymer and/or oligomer including a metal and a polar organic group, the metal lost from the surface of the shell is partially compensated for to improve quantum efficiency, and also dispersity and compatibility of the quantum dot in a polar solvent are improved by the polymer including the polar organic group to improve processability.

According to an embodiment, the metal may include Cd, Zn, Hg, Mg, Ga, Al, In, Sn, Pb, Si, Ge, Si, Ag, Cu, or any combination thereof, without being limited thereto.

For example, the metal may be Zn, In, Cd, and/or Ga.

According to an embodiment, the metal may include a same metal as that included in the crystals of the second semiconductor.

For example, in an embodiment where the second semiconductor crystals include a combination of two or more types (or kinds) of metals, the oligomer and/or polymer may include at least one of the two or more types (or kinds) of metals.

According to an embodiment, the polar organic group may include a hydroxyl group, a carbonyl group, an acryl group, an ester group, an ether group, a carboxyl group, an epoxy group, a halogen group, or any combination thereof, but is not limited thereto, and any functional group capable of providing polarity to a molecule may also be used.

For example, the polar organic group may be an acryl group, an epoxy group, an ether group, or a carboxyl group.

According to an embodiment, the polymer and/or oligomer may include a polymerized product of a monomer represented by Formula 1 below:

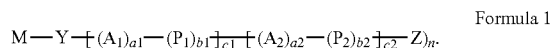

Formula 1

In Formula 1,
M includes Cd, Zn, Hg, Mg, Ga, Al, In, Sn, Pb, Si, Ge, Si, Ag, Cu, or any combination thereof,
Y is an ionic group,
$A_1$ and $A_2$ are each independently selected from a $C_1$-$C_{20}$ alkylene group unsubstituted or substituted with at least one $R_{10a}$, and a $C_2$-$C_{20}$ alkenylene group unsubstituted or substituted with at least one $R_{10a}$,
a1 and a2 are each independently an integer selected from 0 to 10,
when a1 is an integer of 2 or more, 2 or more $A_1$s are the same or different, and when a2 is an integer of 2 or more, 2 or more $A_2$s are the same or different,
$P_1$ and $P_2$ are each independently selected from *—O—*', *—S—*', *—C(=O)—*', *—S(=O)$_2$—*', *—C(=O)(O)—*', *—C($R_1$)=C($R_2$)—C(=O)O$R_3$—*', *—O—C(=O)—C($R_1$)=C($R_2$)—*', and *—C($R_1$)($R_2$)—*',
b1 and b2 are each independently an integer selected from 1 to 10,
when b1 is an integer of 2 or more, 2 or more $P_1$s are the same or different, and when b2 is an integer of 2 or more, 2 or more $P_2$s are the same or different,
c1 and c2 are each independently an integer selected from 0 to 10,
when c1 is an integer of 2 or more, 2 or more *-$(A_1)_{a1}$-$(P_1)_{b1}$—*'s are the same or different, and when c2 is an integer of 2 or more, 2 or more *-$(A_2)_{a2}$-$(P_2)_{b2}$—*'s are the same or different,
$R_1$ to $R_3$ are each independently selected from hydrogen, a hydroxyl group, an alkoxy group, an epoxy group, and a halogen group,
$R_{10a}$ is selected from hydrogen, a $C_1$-$C_{20}$ alkyl group, and a $C_2$-$C_{20}$ alkenyl group,
n is an integer selected from 1 to 5,
when n is an integer of 2 or more, 2 or more

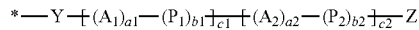

s are the same or different, and
Z is a crosslinkable group including at least one selected from an ethylenically unsaturated group, an epoxy group, an alkoxy group, and an isocyanate group.

According to an embodiment, the ionic group may be an anionic group. For example, the ionic group may be a thiol group, a carboxyl group, an amine group, a phosphate group, a sulfate group, or a nitrate group. As used herein, the term "ionic group" refers to a functional group present in the form of an ion in an aqueous solution and capable of forming a salt together with a metal.

According to an embodiment, the ionic group may be a carboxyl group.

According to an embodiment, the polymer may further include an ionic group, and the ionic group may bind to a metal to be present in the form of a metal salt.

According to an embodiment, the outerlayer may further include the above-described monomer.

According to an embodiment, M of Formula 1 may include the same metal as that included in the second semiconductor crystals. Therefore, some of the monomers not constituting the polymer are dispersed in the first region to correct defects of the surface of the shell, and accordingly, quantum efficiency of the quantum dots may be improved.

According to an embodiment, the polymer may include a crosslinked polymer produced by crosslinking of the crosslinkable group by light, for example, UV light, heat, and/or a crosslinking group.

For example, the crosslinked polymer may be a network crosslinked polymer.

According to an embodiment, when a1 is 0, $A_1$ is a single bond, and a group adjacent to Y may directly bind to Y. When a2 is 0, $A_2$ is a single bond, and a group adjacent to $P_1$ may directly bind $P_1$.

According to an embodiment, $A_1$ and $A_2$ may be each independently a $C_1$-$C_{10}$ alkylene group. For example, $A_1$ and $A_2$ may be each an ethylene group, respectively.

According to an embodiment, $P_1$ and $P_2$ may be each independently *—O—*', *—S—*', *—C(=O)—*', or *—C(=O)(O)—*'. For example, $P_1$ and $P_2$ may be each *—O—*', respectively.

According to an embodiment, Z may be a group selected from Formulae 1-1 to 1-6 below:

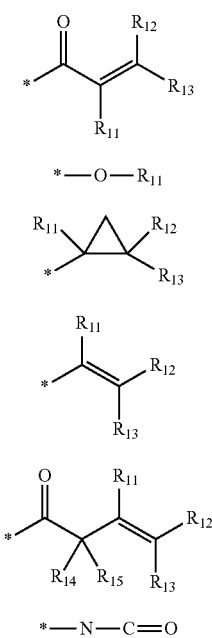

In Formulae 1-1 to 1-6, $R_{11}$ to $R_{15}$ may be each independently selected from hydrogen, —F, —Cl, —Br, —I, a $C_1$-$C_{20}$ alkyl group, and a $C_2$-$C_{20}$ alkenyl group.

For example, $R_{11}$ to $R_{15}$ may be each independently selected from hydrogen, —F, —Cl, —Br, —I, a methyl group, an ethyl group, a n-propyl group, an isopropyl group, a n-butyl group, a sec-butyl group, an isobutyl group, a tert-butyl group, a n-pentyl group, a tert-pentyl group, a neopentyl group, an isopentyl group, a sec-pentyl group, a 3-pentyl group, a sec-isopentyl group, a n-hexyl group, an isohexyl group, a sec-hexyl group, a tert-hexyl group, a n-heptyl group, an isoheptyl group, a sec-heptyl group, a tert-heptyl group, a n-octyl group, an isooctyl group, a sec-octyl group, a tert-octyl group, a n-nonyl group, an isononyl group, a sec-nonyl group, a tert-nonyl group, a n-decyl group, an isodecyl group, a sec-decyl group, and a tert-decyl group, without being limited thereto.

For example, $R_{11}$ to $R_{13}$ may be each independently selected from hydrogen, a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, and a tert-hexyl group.

According to an embodiment, the first ligand may include a $C_1$-$C_{20}$ hydrocarbon group.

For example, the first ligand may include a $C_1$-$C_{20}$ hydrocarbon group having at least one ethylenically unsaturated group.

According to an embodiment, the first ligand may further include an ionic group. For example, the ionic group may be a thiol group, a carboxyl group, an amine group, a phosphate group, a sulfate group, or a nitrate group.

According to an embodiment, the first ligand may include an ionic group and a $C_1$-$C_{20}$ hydrocarbon group. For example, the ionic group binds to the surface of the shell via a coordinate covalent bond, and the $C_1$-$C_{20}$ hydrocarbon group may be oriented toward the outerlayer. For example, the first ligand may be oleic acid.

According to an embodiment, the first semiconductor and the second semiconductor may each independently include: a Group II-VI semiconductor compound; a Group III-V semiconductor compound; a Group III-VI semiconductor compound; a Group I-III-VI semiconductor compound; a Group IV-VI semiconductor compound; a Group IV element or compound; or any combination thereof.

Examples of the Group II-VI semiconductor compound may include: a binary compound such as CdS, CdSe, CdTe, ZnS, ZnSe, ZnTe, ZnO, HgS, HgSe, HgTe, MgSe, and MgS; a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS; a quaternary compound such as CdZnSeS, CdZnSeTe, CdZnSTe, CdHgSeS, CdHgSeTe, CdHgSTe, HgZnSeS, HgZnSeTe, and HgZnSTe; or any combination thereof.

Examples of the Group III-V semiconductor compound may include a binary compound such as GaN, GaP, GaAs, GaSb, AlN, AlP, AlAs, AlSb, InN, InP, InAs, and InSb; a ternary compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, and InPSb; a quaternary compound such as GaAlNP GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb; or any combination thereof. In some embodiments, the Group III-V semiconductor compound may further include a Group II element. Examples of the Group III-V semiconductor compound further including a Group II element may include InZnP, InGaZnP, and InAlZnP.

Examples of the Group III-VI semiconductor compound may include: a binary compound such as GaS, GaSe, $Ga_2Se_3$, GaTe, InS, InSe, $In_2Se_3$, and InTe; a ternary compound such as $InGaS_3$ and InGaSes; or any combination thereof.

Examples of the Group I-III-VI semiconductor compound may include: a ternary compound such as AgInS, $AgInS_2$, CuInS, $CuInS_2$, $CuGaO_2$, $AgGaO_2$, and $AgAlO_2$; or any combination thereof.

Examples of the Group IV-VI semiconductor compound may include: a binary compound such as SnS, SnSe, SnTe, PbS, PbSe, and PbTe; a ternary compound such as SnSeS, SnSeTe, SnSTe, PbSeS, PbSeTe, PbSTe, SnPbS, SnPbSe, and SnPbTe; a quaternary compound such as SnPbSSe, SnPbSeTe, and SnPbSTe; or any combination thereof.

The Group IV element or compound may include: a single element such as Si or Ge; a binary compound such as SiC and SiGe; or any combination thereof.

Each element included in the multielement compound such as the binary compound, the ternary compound, and the quaternary compound may be present in the quantum dot particle in a uniform or non-uniform concentration.

In some embodiments, the quantum dot may have a core-shell double structure in which each of the elements included in the quantum dot has a uniform (e.g., substantially uniform) concentration. For example, a material contained in the core may be different from a material contained in the shell.

The shell of the quantum dot may serve as a protective layer to maintain properties of the semiconductor by inhibiting or reducing chemical deformation of the core and/or a charging layer to provide electrophoretic properties to the quantum dot. The shell may have a single-layered or multi-layered structure. An interface between the core and the shell may have a concentration gradient in which the concentration of the element present in the shell decreases along a direction toward the center of the core.

According to an embodiment, the first semiconductor may include GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, InZnP, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or any combination thereof, and the second semiconductor may include CdS, CdSe, CdTe, ZnS, ZnSe, ZnTe, ZnO, HgS, HgSe, HgTe, MgS, MgSe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe MgZnS, MgZnSe, CdZnSeS, CdZnSeTe, CdZnSTe, CdHgSeS, CdHgSeTe, CdHgSTe, HgZnSeS, HgZnSeTe, HgZnSTe, or any combination thereof, without being limited thereto.

According to an embodiment, the shell may have a single-layered or multi-layered structure.

According to an embodiment, the shell may be a composite single-layered shell including crystals of two different types (or kinds) of second semiconductors. In this case, the above-described first region including the first ligand may be provided to at least one portion of the composite single-layered shell or to cover the entire external surface of the composite single-layered shell.

According to an embodiment, the shell may include particles of two different types (or kinds) of semiconductors including Zn metal.

According to an embodiment, the shell may include two different types (or kinds) of Group II-IV semiconductor compounds. For example, the shell may include ZnSe and ZnS.

According to an embodiment, the shell may include a double-layered shell including a first shell and a second shell and the first shell may be interposed between the core and the second shell. In this case, the first shell and the second shell may include crystals of different second semiconductors.

For example, the first shell may include ZnSe and the second shell may include ZnS.

The quantum dot emits visible light. For example, the quantum dot may emit light having various suitable maximum emission wavelengths according to a diameter of the quantum dot. As an example, the quantum dot may emit light having a maximum emission wavelength of 430 nm to 800 nm. Therefore, when the quantum dot is applied to a color conversion member, high brightness and high color purity may be realized.

According to an embodiment, the quantum dots may have an average diameter of 1 nm to 15 nm. For example, the quantum dots may have an average diameter of 2 nm to 13 nm or 2 nm to 10 nm.

According to an embodiment, the shape of the quantum dot is not particularly limited and the quantum dot may have any suitable shape generally used in the art. For example, the quantum dot may be in the form of nanoparticles having a spherical, pyramidal, multi-arm, or cubic shape, nanotubes, nanowires, nanofibers, or nanoplates.

Ink Composition

According to another embodiment, provided is an ink composition including the above-described quantum dot.

According to an embodiment, the ink composition may be a solvent-free type (or kind) ink composition that substantially does not include a solvent. For example, the ink composition may include a solvent that inevitably remains after the quantum dots are prepared, and an amount of the solvent may be about 5 wt % or less based on a total weight of the composition. The solvent remaining in the quantum dots may be removed by an additional purification process.

Because the ink composition does not include a solvent, a simplified process and increased economic feasibility may be achieved by omitting a solvent removal stage.

According to an embodiment, in the ink composition, an amount of the quantum dots may be from 0.1 wt % to 50 wt %, for example, from 10 wt % to 50 wt %, or from 10 wt % to 45 wt % based on a total weight of the composition.

The ink composition may have a viscosity of 1 cP to 30 cP at room temperature (e.g., 25° C.). For example, the ink composition may have a viscosity from 5 cp to 30 cp, from 10 cp to 30 cp, or from 20 cp to 25 cp. The ink composition including a viscosity satisfying the above-described range may be suitable for preparing a color conversion member located on the exterior of a light-emitting device or preparing a quantum dot light-emitting layer.

According to an embodiment, the ink composition may further include a polymerization initiator. The polymerization initiator may include a thermal polymerization initiator and/or a photo-polymerization initiator.

As the thermal polymerization initiator, any suitable compound capable of forming a radical by heat may be used without limitation. Examples of the thermal polymerization initiator may include a persulfate-based compound, such as sodium persulfate ($Na_2S_2O_8$), potassium persulfate ($K_2S_2O_8$), and ammonium persulfate (($NH_4$)$_2S_2O_8$), an azo compound, such as 2,2-azobis(2-amidinopropane) dihydrochloride, 2,2-azobis-(N,N-dimethylene)isobutyramidine dihydrochloride, 2-(carbamoylazo)isobutylonitril, 2,2-azobis[2-(2-imidazolin-2-yl)propane]dihydrochloride, 4,4-azobis-(4-cyanovaleric acid), hydrogen peroxide, or any combination thereof.

When the thermal polymerization initiator is used, an amount of thereof may be from 0.01 parts by weight to 15 parts by weight based on a total weight of the ink composition.

As the photo-polymerization initiator, any suitable compound capable of forming a radical by UV light having a maximum emission wavelength of 200 nm to 400 nm may be used without limitation, and examples of the photo-polymerization initiator may include a compound including a combination of a cation selected from arylsulfonium, aryldiazonium, and arylammonium, and an anion selected from $AsF_6^-$, $SbF_6^-$, $PF_6^-$, and tetrakis(pentafluorophenyl) borate, and/or may include an organosilane compound.

When the photo-polymerization initiator is used, an amount thereof may be from 0.01 parts by weight to 15 parts by weight based on the total weight of the ink composition.

According to an embodiment, the ink composition may further include various suitable additives to improve ejection and applicability of the ink composition, thereby improving optical properties of a thin film cured therefrom within a range not (or substantially not) affecting physical properties of the quantum dot.

For example, the ink composition may further include any suitable dispersant, any suitable viscosity modifier, and/or the like generally used in the art, to improve ejection properties and applicability and may further include any suitable surfactant, any suitable scatterer (e.g., any suitable light scatterer), any suitable defoaming agent, any suitable UV stabilizer, any suitable moisture absorbent, any suitable antioxidant, and/or the like generally used in the art, to improve optical properties of a cured thin film prepared from the ink composition. In some embodiments, the additives may be used in amount ranges not (or substantially not) affecting physical properties of the quantum dot.

According to an embodiment, the ink composition may further include a diacrylate-based monomer. For example, the diacrylate-based monomer may include an alkyldiol diacrylate monomer. In some embodiments, the alkyldiol diacrylate monomer may include a hexanediol diacrylate monomer.

According to another embodiment, the ink composition may optionally further include a solvent.

The solvent is not particularly limited as long as the solvent is able to uniformly (e.g., substantially uniformly) disperse the quantum dots. For example, the solvent may be an organic solvent.

In some embodiments, the solvent may be selected from chlorine-based, ether-based, ester-based, ketone-based, aliphatic hydrocarbon-based, and aromatic hydrocarbon-based solvents, without being limited thereto.

For example, the solvent may include dichloromethane, 1,2-dichloroethane, 1,1,2-trichloroethane, chlorobenzene, o-dichlorobenzene, and/or cyclohexylbenzene; tetrahydrofuran, dioxane, anisole, 4-methylanisole, butyl phenylether; toluene, xylene, mesitylene, ethylbenzene, n-hexylbenzene, cyclohexylbenzene, trimethylbenzene, and/or tetrahydronaphthalene; cyclohexane, methylcyclohexane, n-pentane, n-hexane, n-heptane, n-octane, n-nonane, n-decane, dodecane, hexadecane, and/or oxadecane; acetone, methylethylketone, cyclohexanone, and/or acetophenone; acetic acidethyl, acetic acidbutyl, methylcellosolve acetate, ethylcellosolve acetate, methyl benzoate, ethyl benzoate, butyl benzoate, 3-phenoxy benzoate, or any combination thereof, without being limited thereto.

In the ink composition, an amount of the solvent may be form 80 parts by weight to 99.9 parts by weight, or for example, from 90 parts by weight to 99.8 parts by weight, based on the total weight of the composition, without being limited thereto. When the above-described ranges are satisfied, the quantum dots may be suitably or appropriately dispersed in the ink composition and the ink composition may have a suitable or appropriate solid concentration in a solution.

According to an embodiment, the ink composition including the above-described quantum dot may be applied to the exterior of a light-emitting device to form an optical member. In this case, the optical member may be a color conversion member having a function of absorbing light emitted from the light-emitting device and emitting light having a different wavelength band (e.g., may convert light of one wavelength emitted from the light-emitting device to light of another wavelength).

Electronic Device

Hereinafter, an electronic device including the above-described quantum dot will be described.

The electronic device may include the quantum dot and a light-emitting device including a first electrode; a second electrode; and an intermediate layer interposed between the first electrode and the second electrode.

According to an embodiment, the electronic device may include a liquid crystal display, an organic light emitting display device, or an inorganic light emitting display device.

For example, when the electronic device further includes liquid crystals, the electronic device may be a liquid crystal display. In this case, the light-emitting device may serve as a light source, and the quantum dot may serve as a color conversion member in a state of being included in the exterior of the light-emitting device and the liquid crystals.

As another example, when the intermediate layer of the light-emitting device includes a light-emitting layer and the light-emitting layer includes an organic material, the electronic device may be an organic light emitting display device. In this case, the light-emitting device may serve as a light source, and the quantum dot may serve as a color conversion member in a state of being included in the exterior of the light-emitting device.

As another example, when the intermediate layer of the light-emitting device includes a light-emitting layer and the light-emitting layer includes an inorganic material, for example, the quantum dot, the electronic device may be an inorganic light emitting display device.

The electronic device may further include a thin film transistor in addition to the above-described light-emitting device. The thin film transistor may include a source electrode, a drain electrode, and an active layer, and one selected from the source electrode and the drain electrode may be electrically connected to one selected from the first electrode and the second electrode of the light-emitting device.

The thin film transistor may further include a gate electrode, a gate insulating layer, and/or the like.

The active layer may include crystalline silicon, amorphous silicon, an organic semiconductor, an oxide semiconductor, and/or the like.

The electronic device may further include a sealing part that seals the light-emitting device. The sealing part allows light to be taken out of the light-emitting device concurrently (e.g., simultaneously) preventing or reducing infiltration of external air and/or moisture into the light-emitting device. The sealing part may be a sealing substrate including a transparent glass substrate and/or plastic substrate. The sealing part may be a thin film encapsulation layer including one or more organic layers and/or inorganic layers. When the sealing part is a thin film encapsulation layer, the electronic device may be flexible.

Various suitable functional layers may further be located on the sealing part according to the use of the electronic device. Examples of the functional layers may include a color filter, a color conversion layer, a touchscreen layer, and a polarization layer. The touchscreen layer may be a pressure-sensitive touchscreen layer, a capacitive touchscreen layer, and/or an infrared touchscreen layer.

Figure 2:
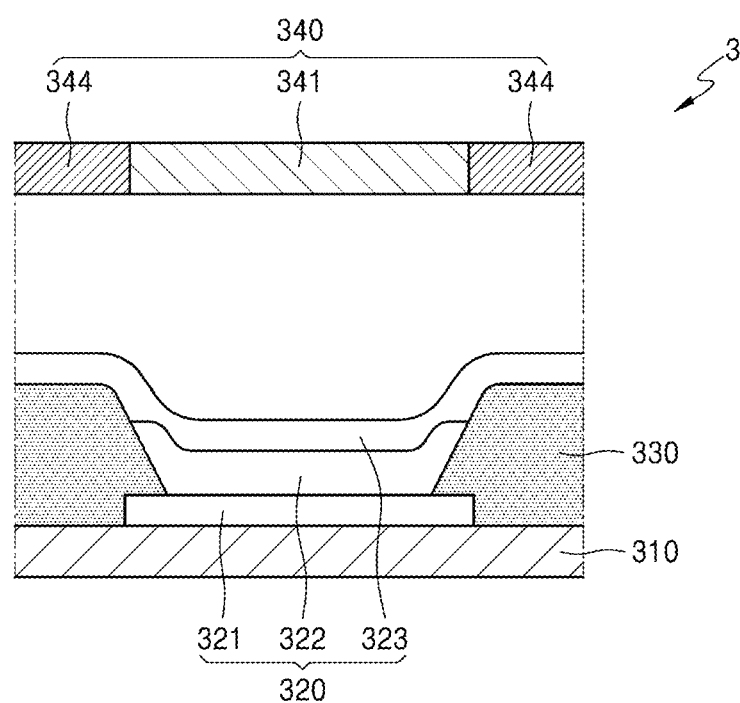
FIG. 2 is a schematic cross-sectional view of a structure of a light-emitting device according to an embodiment of the present disclosure.

Hereinafter, an electronic device 3 including a light-emitting device 320 according to an embodiment will be described in more detail with reference to FIG. 2.

The electronic device 3 includes a first substrate 310, the light-emitting device 320, and a second substrate 340.

The quantum dot may be included in the exterior of the light-emitting device 320 (e.g., on the first electrode and/or second electrode). For example, the quantum dot may be included in the second substrate 340 located on the exterior of the light-emitting device 320. The second substrate 340 may serve as a color conversion member and the light-emitting device 320 may serve as a light source.

The light-emitting device 320 includes a first electrode 321, a second electrode 323, and an intermediate layer 322 interposed between the first electrode 321 and the second electrode 323.

The electronic device 3 may be an organic light emitting display device. Accordingly, the light-emitting device 320 may include an organic light-emitting layer in the intermediate layer 322.

A pixel defining layer 330 may be located on the first electrode 321. The pixel defining layer 330 exposes a set or predetermined region of the first electrode 321, and the intermediate layer 322 may be located on the exposed region.

In an embodiment, one region 341 of the second substrate 340 may include nanoparticles of the semiconductor. In this case, the second substrate 340 may be located in a traveling direction of light emitted from the light-emitting device 320.

The quantum dot may emit visible light by absorbing blue light. Accordingly, the second substrate 340 may be designed to emit light having various suitable wavelengths by absorbing blue light. Accordingly, the light-emitting device 320 may emit blue light, e.g., blue light having a maximum emission wavelength of 400 nm to 490 nm, and the thin film may emit visible light, e.g., visible light having a maximum emission wavelength of 445 nm to 650 nm, by absorbing the blue light.

In an embodiment, the second substrate 340 may further include a scatterer (e.g., a light scatterer).

In an embodiment, the second substrate 340 further include another region distinguished from the former region 341, and the latter region does not include nanoparticles of the semiconductor and may transmit blue light emitted from the light-emitting device. For example, only the former region 341 includes nanoparticles of the semiconductor and the latter region may include only the scatterer (e.g., the light scatterer).

In an embodiment, the second substrate 340 may further include a light-shielding pattern 344 between the former region and the latter region.

Figure 3:
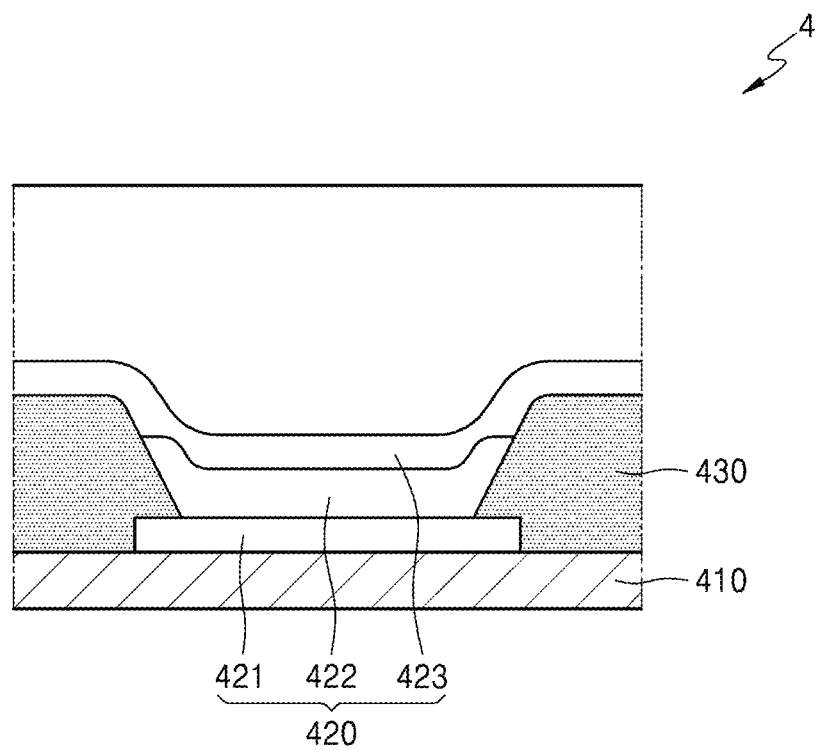
FIG. 3 is a schematic cross-sectional view of a structure of a light-emitting device according to an embodiment of the present disclosure.

Hereinafter, an electronic device 4 according to another embodiment will be described in more detail with reference to FIG. 3.

The electronic device 4 includes a first substrate 410 and a light-emitting device 420.

The light-emitting device 420 includes a first electrode 421, a second electrode 423, and an intermediate layer 422 interposed between the first electrode 421 and the second electrode 423.

The quantum dot may be included in the intermediate layer 422. For example, the quantum dot may be included in the light-emitting layer included in the intermediate layer 422.

The quantum dot may emit visible light. Accordingly, the light-emitting device 420 may be designed to emit light having various suitable wavelengths. For example, the quantum dot may emit visible light having a maximum emission wavelength of 445 nm to 650 nm.

The intermediate layer 422 may further include an auxiliary layer between the light-emitting layer and the first electrode and/or between the light-emitting layer and the second electrode. The auxiliary layer may be in direct contact (e.g., physical contact) with the light-emitting layer. The auxiliary layer may improve thin film properties of the light-emitting layer.

The intermediate layer 422 may further include a first charge transport region interposed between the light-emitting layer and the first electrode and/or a second charge transport region interposed between the light-emitting layer and the second electrode.

Method of Manufacturing Quantum Dot

A method of manufacturing the quantum dot will now be described in more detail.

The method of manufacturing the quantum dot may include forming core particles using a first semiconductor compound, forming core/shell particles including a shell formed of a second semiconductor by bringing the core particles into contact (e.g., physical contact) with a second semiconductor compound precursor, and forming an outer-layer on the core/shell particles.

The first semiconductor compound may include indium (In), gallium (Ga), and/or phosphorus (P), and the second semiconductor compound may include zinc (Zn), selenium (Se), and/or sulfur (S).

According to an embodiment, the second semiconductor compound precursor may include a first precursor and a second precursor of the second semiconductor compound. For example, the first precursor may include zinc (Zn) and/or selenium (Se), and the second precursor may include zinc (Zn) and/or sulfur (S).

According to an embodiment, the process of bringing the core particles into contact (e.g., physical contact) with the second semiconductor compound precursor may include (i) an operation of bringing the core particles into the first precursor compound of the second semiconductor compound, and (ii) an operation of bringing the second precursor compound of the second semiconductor compound thereinto.

The operation (i) may be performed at a temperature of 290° C. to 350° C., e.g., 300° C. to 340° C., for 30 minutes to 90 minutes, e.g., for 50 minutes to 70 minutes, and the operation (ii) may be performed at a temperature of 290° C. to 350° C., e.g., 300° C. to 340° C., for 60 minutes to 120 minutes, e.g., for 80 minutes to 100 minutes.

Accordingly, a composite single-layered shell or a double-layered shell including two types (or kinds) of second semiconductor compounds may be formed on the core particles.

According to an embodiment, the forming of the outer-layer on the core/shell particles may include providing an oligomer and/or polymer including a metal and a polar organic group on the core/shell particles. In this case, the metal may be one constituting the second semiconductor compound, for example, Zn.

In an embodiment, the method may further include purification and/or separation processes after forming the core particles and, in some embodiments, these processes may be omitted.

In an embodiment, the solvent may be an organic solvent. For example, the solvent may include trioctylamine, oleylamine, 1-octadecene (ODE), and/or the like.

Additional details of the method of manufacturing semiconductor nanoparticles may be recognized by those skilled in the art with reference to examples to be further described herein below.

Definition of at Least Some of the Terms

Throughout the specification, the term "$C_3$-$C_{60}$ carbocyclic group" refers to a cyclic group including only 3 to 60 carbon atoms, and a $C_1$-$C_{60}$ heterocyclic group refers to a cyclic group including 1 to 60 carbon atoms and further including a hetero atom in addition to carbon atoms.

Throughout the specification, the term "cyclic group" includes both the $C_3$-$C_{60}$ carbocyclic group and the $C_1$-$C_{60}$ heterocyclic group.

Throughout the specification, the terms "cyclic group," "$C_3$-$C_{60}$ carbocyclic group," and "$C_1$-$C_{60}$ heterocyclic group" refer to a group condensed in a cyclic group, e.g., a monovalent or polyvalent group (for example, a divalent group, a trivalent group, a tetravalent group, or the like), according to a structure of the formula used therein. For example, the "benzene group" may be a benzo group, a phenyl group, or a phenylene group which may be easily understood by those of ordinary skill in the art according to a structure in which the "benzene group" is included.

For example, examples of a monovalent $C_3$-$C_{60}$ carbocyclic group and a monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, or a $C_1$-$C_{60}$ heteroaryl group, a monovalent non-aromatic condensed polycyclic group, and a monovalent non-aromatic condensed heteropolycyclic group, and examples of a divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a divalent non-aromatic condensed heteropolycyclic group.

Throughout the specification, the term "$C_1$-$C_{60}$ alkyl group" refers to a monovalent linear or branched aliphatic hydrocarbon group including 1 to 60 carbon atoms and examples thereof may include a methyl group, an ethyl group, a n-propyl group, an isopropyl group, a n-butyl group, a sec-butyl group, an isobutyl group, a tert-butyl group, a n-pentyl group, a tert-pentyl group, a neopentyl group, an isopentyl group, a sec-pentyl group, a 3-pentyl group, a sec-isopentyl group, a n-hexyl group, an isohexyl group, a sec-hexyl group, a tert-hexyl group, a n-heptyl group, an isoheptyl group, a sec-heptyl group, a tert-heptyl group, a n-octyl group, an isooctyl group, a sec-octyl group, a tert-octyl group, a n-nonyl group, an isononyl group, a sec-nonyl group, a tert-nonyl group, a n-decyl group, an isodecyl group, a sec-decyl group, and a tert-decyl group. Throughout the specification, the term "$C_1$-$C_{60}$ alkylene group" refers to a divalent group having substantially the same structure as that of the $C_1$-$C_{60}$ alkyl group.

Throughout the specification, the term "$C_2$-$C_{60}$ alkenyl group" refers to a monovalent hydrocarbon group including one carbon-carbon double bond at a main chain (e.g., in the middle) or at one end (e.g., a terminal end) of the $C_2$-$C_{60}$ alkyl group, and examples thereof may include an ethenyl group, a propenyl group, and a butenyl group. Throughout the specification, the term "$C_2$-$C_{60}$ alkenylene group" refers to a divalent group having substantially the same structure as that of the $C_2$-$C_{60}$ alkenyl group.

Throughout the specification, the term "$C_2$-$C_{60}$ alkynyl group" refers to a monovalent hydrocarbon group including a carbon-carbon triple bond at a main chain (e.g., in the middle) or at one end (e.g., a terminal end) of the $C_2$-$C_{60}$ alkyl group, and examples thereof may include an ethynyl group and a propynyl group. Throughout the specification, the term "$C_2$-$C_{60}$ alkynylene group" refers to a divalent group having substantially the same structure as that of the $C_2$-$C_{60}$ alkynyl group.

Throughout the specification, the term "$C_1$-$C_{60}$ alkoxy group" refers to a monovalent group represented by —$OA_{101}$ (where $A_{101}$ is the $C_1$-$C_{60}$ alkyl group), and examples thereof may include a methoxy group, an ethoxy group, and an isopropyloxy group.

Throughout the specification, the term "$C_3$-$C_1$ cycloalkyl group" refers to a monovalent saturated hydrocarbon group including 3 to 10 carbon atoms, and example thereof may include a cyclopropyl group, a cyclobutyl group, a cyclopentyl group, a cyclohexyl group, a cycloheptyl group, and a cyclooctyl group.

Throughout the specification, the term "$C_1$-$C_{10}$ heterocycloalkyl group" refers to a monovalent cyclic group including 1 to 10 carbon atoms and further including at least one hetero atom as a ring-forming atom in addition to the carbon atoms. Throughout the specification, the term "$C_1$-$C_{10}$ heterocycloalkylene group" may refer to divalent group having substantially the same structure as that of the $C_1$-$C_{10}$ heterocycloalkyl group.

Throughout the specification, the term "$C_3$-$C_{10}$ cycloalkenyl group" refers to a monovalent cyclic group including 3 to 10 carbon atoms and at least one carbon-carbon double bond in a ring without having aromaticity (e.g., without being aromatic), and examples thereof may include a cyclopentenyl group, a cyclohexenyl group, and a cycloheptenyl group. Throughout the specification, the term "$C_3$-$C_{10}$ cycloalkenylene group" refers to a divalent group having substantially the same structure as that of the $C_3$-$C_{10}$ cycloalkenyl group.

Throughout the specification, the term "$C_1$-$C_{10}$ heterocycloalkenyl group" refers to a monovalent cyclic group including 1 to 10 carbon atoms and at least one hetero atom as a ring-forming atom in addition to the carbon atoms and includes at least one double bond in the ring. Examples of the $C_1$-$C_{10}$ heterocycloalkenyl group may include 4,5-dihydro-1,2,3,4-oxatriazolyl group, a 2,3-dihydrofuranyl group, and a 2,3-dihydrothiophenyl group. Throughout the specification, the term "$C_1$-$C_{10}$ heterocycloalkenylene group" refers to a divalent group having substantially the same structure as that of the $C_1$-$C_{10}$ heterocycloalkenyl group.

Throughout the specification, the term "$C_6$-$C_{60}$ aryl group" refers to a monovalent group having a carbocyclic aromatic system including 6 to 60 carbon atoms, and the term "$C_6$-$C_{60}$ arylene group" refers to a divalent group having a carbocyclic aromatic system including 6 to 60 carbon atoms. Example of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a heptalenyl group, a naphthacenyl group, a pycenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group include two or more rings, the two or more rings may be condensed (e.g., combined together with each other).

Throughout the specification, the term "$C_1$-$C_{60}$ heteroaryl group" refers to a monovalent group having a heterocyclic aromatic system including 1 to 60 carbon atoms and further including at least one hetero atom as a ring-forming atom in addition to the carbon atoms, and the term "$C_1$-$C_{60}$ heteroarylene group" refers to a divalent group having a heterocyclic aromatic system including 1 to 60 carbon atoms and at least one hetero atom as a ring-forming atom in addition to the carbon atoms.

Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinolinyl group, a phenanthrolinyl group, a phthalazinyl group, and a naphthyridinyl group. When the $C_1$-$C_{60}$ heteroaryl group and the $C_1$-$C_{60}$ heteroarylene group include 2 or more rings, the 2 or more rings may be condensed with (e.g., combined together with) each other.

Throughout the specification, the term "monovalent non-aromatic condensed polycyclic group" refers to a monovalent group in which two or more rings are condensed with (e.g., combined together with) each other, only carbon atoms are used to form rings, and the entire molecule has non-aromaticity (for example, is not aromatic and. The monovalent non-aromatic condensed polycyclic group or rings thereof may include 8 to 60 carbon atoms. Examples of the monovalent non-aromatic condensed polycyclic group may include an indenyl group, a fluorenyl group, a spiro-bifluorenyl group, a benzefluorenyl group, an indenophenanthrenyl group, and an indeoanthracenyl group. Throughout the specification, the term "divalent non-aromatic condensed polycyclic group" refers to a divalent group having substantially the same structure as that of the monovalent non-aromatic condensed polycyclic group.

Throughout the specification, the term "monovalent non-aromatic condensed heteropolycyclic group" refers to a monovalent group in which two or more rings are condensed with (e.g., combined together with) each other, at least one hetero atom is used as a ring-forming atom in addition to the carbon atoms, and the entire molecule has non-aromaticity (e.g., is not aromatic). The monovalent non-aromatic condensed heteropolycyclic group or rings thereof may include 1 to 60 carbon atoms. Examples of the monovalent non-aromatic condensed heteropolycyclic group may include a pyrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isooxazolyl group, a thiazolyl group, an isothiazolyl group, an oxadiazolyl group, a thiadiazolyl group, a benzopyrazolyl group, a benzoimidazolyl group, a benzooxazolyl group, a benzothiazolyl group, a benzooxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. Throughout the specification, the term "divalent non-aromatic condensed heteropolycyclic group" refers to a divalent group having substantially the same structure as that of the monovalent non-aromatic condensed heteropolycyclic group.

Throughout the specification, the term "$C_6$-$C_{60}$ aryloxy group" refers to —$OA_{102}$ (where $A_{102}$ is the $C_6$-$C_{60}$ aryl group), and the term "$C_6$-$C_{60}$ arylthio group" refers to —$SA_{103}$ (where $A_{103}$ is the $C_6$-$C_{60}$ aryl group).

Throughout the specification, the group "$R_{10a}$" may be
deuterium (-D), —F, —Cl, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, or a $C_1$-$C_{60}$ alkoxy group unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;
a $C_3$-$C_{60}$ carbocyclic group, a $C_1$-$C_{60}$ heterocyclic group, a $C_6$-$C_{60}$ aryloxy group, or a $C_6$-$C_{60}$ arylthio group unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or
—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

Throughout the specification, $Q_1$ to $Q_3$, $Q_{11}$ to $Q_{13}$, $Q_{21}$ to $Q_{23}$ and $Q_{31}$ to $Q_{33}$ may be each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group unsubstituted or substituted with deuterium, —F, a cyano group, a $C_1$-$C_{60}$ alkyl group, a $C_1$-$C_{60}$ alkoxy group, a phenyl group, a nonphenyl group, or any combination thereof.

Throughout the specification, the hetero atom refers to any atom except for carbon atoms. Examples of the hetero atom may include O, S, N, P, Si, B, Ge, Se, or any combination thereof.

Throughout the specification, "Ph" is a phenyl group, "Me" is a methyl group, "Et" is an ethyl group, "ter-Bu" or "Bu$^t$" is a tert-butyl group, and "OMe" is a methoxy group.

Throughout the specification, the "nonphenyl group" refers to a "phenyl group substituted a phenyl group". The "non-phenyl group" belongs to a "substituted phenyl group" having a "$C_6$-$C_{60}$ aryl group" as a substituent.

Throughout the specification, the "terphenyl group" refers to a "phenyl group substituted with a nonphenyl group". The "terphenyl group" belongs to a "substituted phenyl group" having a "$C_6$-$C_{60}$ aryl group substituted with a $C_6$-$C_{60}$ aryl group" as a substituent.

Throughout the specification, * and *' refer to binding sites with neighboring atoms in the formulae unless otherwise defined.

Hereinafter, compounds and light-emitting devices according to one or more embodiments of the present disclosure will be described in more detail with reference to the following examples.

EXAMPLES

Evaluation of Quantum Efficiency of InGaP—ZnSe—ZnS Quantum Dot Before/after Ligand Exchange Reaction Photoluminescence quantum efficiency (PLQY) of a quantum dot dispersion including InGaP—ZnSe—ZnS quantum dots ("Reference Example 1") was measured using a QE-2100 device of Otsuka electronics. Subsequently, after removing impurities from the dispersion by purifying the dispersion ("Reference Example 2"), photoluminescence quantum efficiency was measured in the same manner.

Subsequently, a polyethyleneglycol (PEG) ligand was added to the quantum dot dispersion in which the InGaP—ZnSe—ZnS quantum dots were dispersed to obtain PEG-modified quantum dots ("Control 1") in which surfaces of the InGaP—ZnSe—ZnS quantum dots were partially substituted with the PEG ligand. Zn-PEG was added to the quantum dot dispersion in which the same quantum dots were dispersed to obtain Zn-PEG-modified quantum dots ("Control 2") in which surfaces of the InGaP—ZnSe—ZnS quantum dots were partially substituted with the Zn-PEG ligand.

Photoluminescence quantum efficiencies of Control 1 and Control 2 were measured using the QE-2100 device.

Figure 4:
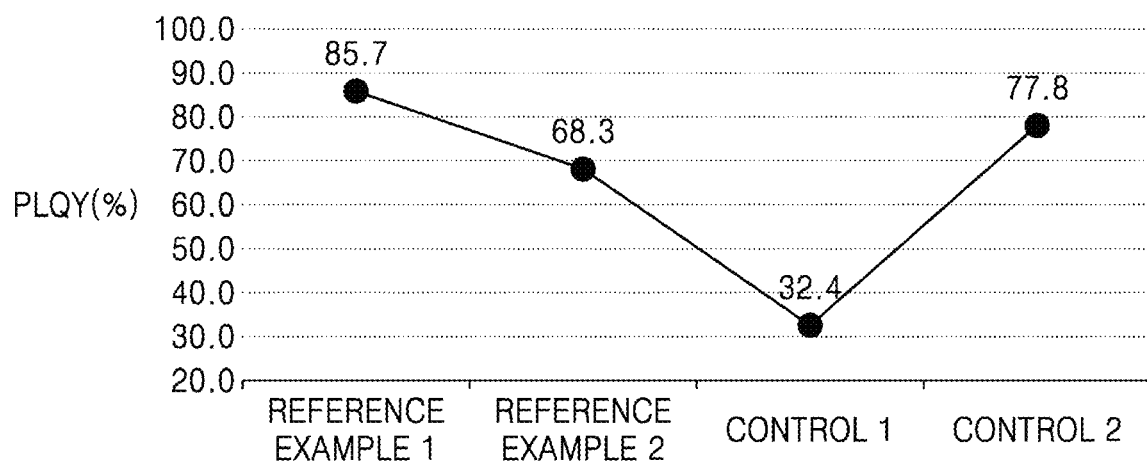
FIG. 4 is a graph showing photoluminescence quantum efficiencies of Control 1 and Control 2, measured using the QE-2100 device.

The measured photoluminescence quantum efficiencies are shown in FIG. 4.

Referring to FIG. 4, it can be seen that the quantum efficiency of Reference Example 2 that was purified once decreased compared to Reference Example 1. In the case of Control 1 in which the surface of the quantum dot was substituted with the PEG ligand, a significant decrease in quantum efficiency was observed. In the case of Control 2 in which the surface of the quantum dot was substituted with the Zn-PEG ligand, a significant increase in quantum efficiency compared to Control 1 was observed. In the case of Control 2, quantum efficiency equivalent to that of quantum dot before ligand substitution was observed.

While the present application is not limited by any particular mechanism or theory, in the case of Reference Example 2, it is believed that quantum efficiency decreased because some of the metal was detached from the quantum dot during the purification process. Further, in the case of Control 1, it is believed that quantum efficiency significantly decreased because the transition metal (e.g., Zn) linked to the ligand was removed by ligand exchange reaction. On the contrary, in the case of Control 2, it is believed that quantum efficiency of the quantum dot significantly increased because the transition metal (e.g., Zn) removed by the ligand exchange reaction was compensated for by the Zn metal of the Zn-PEG ligand, and therefore it was observed that ligand exchange reaction is possible without a substantial decrease in the quantum efficiency.

Evaluation of Compatibility by Substitution of Zn-PEG Ligand

Dispersity test of the Control 1 and Control 2 prepared as described above in hexanediol diacrylate (HDDA) was performed. Hexanediol diacrylate is a reactive diluent used in a quantum dot composition. Light emitting performance after film formation may be identified based on the test whether dispersity of the quantum dot in HDDA is maintained.

Figure 5:
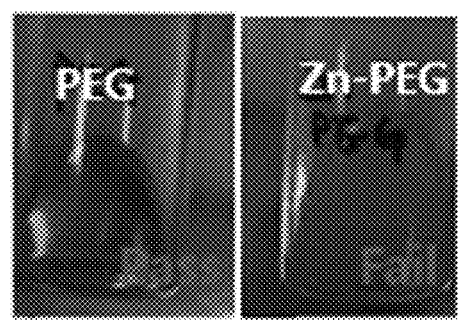
FIG. 5 is an image of showing the dispersity of the control 1 and control 2 after 24 hours.

The test was performed by adding 5 mL of HDDA to Control 1 and 2, and keeping them for 24 hours. Dispersity was visually observed. The results are shown in FIG. 5. While dispersity was maintained in Control 1, dispersity was not maintained in Control 2.

In the case of Control 2, it is considered that the quantum dots were not dispersed in HDDA because Zn-PEG was dissolved therein.

Calculation of Solubility of Ligand

M-PEG5-Zn, acryl-PEG5-Zn, crosslinkedPEG2-Zn, crosslinkedPEG3-Zn were used as examples of the oligomer or polymer including a metal introduced onto the surface of quantum dot via ligand exchange reaction and a polar organic group. $R_a$ values thereof with respect to HDDA were calculated, and the results are shown in Table 1 below. In this regard, the $R_a$ value was calculated using a Hansen Solubility Parameter (HSP) which is defined by the following equation. An $R_a$ value higher than that of HDDA indicates low solubility and high dispersity.

$$R_a = 4 \times (\delta D_{ligand} - \delta D_{HDDA})^2 + (\delta P_{ligand} - \delta P_{HDDA})^2 + (\delta H_{ligand} - \delta H_{HDDA})^2)^{1/2}$$

$\delta D_{ligand}$ is energy (unit: $Mpa^{0.5}$) by dispersion force between ligand molecules;

$\delta D_{HDDA}$ is energy by dispersion force between HDDA molecules;

$\delta P_{ligand}$ is energy by dipolar intermolecular force between ligand molecules;

$\delta P_{HDDA}$ is energy by dipolar intermolecular force between HDDA molecules;

$\delta H_{ligand}$ is energy by hydrogen bond between ligand molecules; and $\delta H_{HDDA}$ is energy by hydrogen bond between HDDA molecules.

TABLE 1

|  |  | δD | δP | δH | δTot | Ra |
|---|---|---|---|---|---|---|
| Reactive diluent | HDDA | 16.3 | 3.9 | 5.1 | 17.5 | — |
| Ligand | m-PEG5-Zn | 16.4 | 7.6 | 8.3 | 19.9 | 4.9 |
|  | acryl-PEG5-Zn | 16.4 | 8.3 | 8.2 | 20.1 | 5.4 |
|  | crosslinkedPEG2-Zn | 15.8 | 10.2 | 9.9 | 21.3 | 8.0 |
|  | crosslinkedPEG3-Zn | 15.7 | 11.4 | 11.6 | 22.6 | 10.0 |

TABLE 1-continued

|   | δD | δP | δH | δTot | Ra |
|---|---|---|---|---|---|

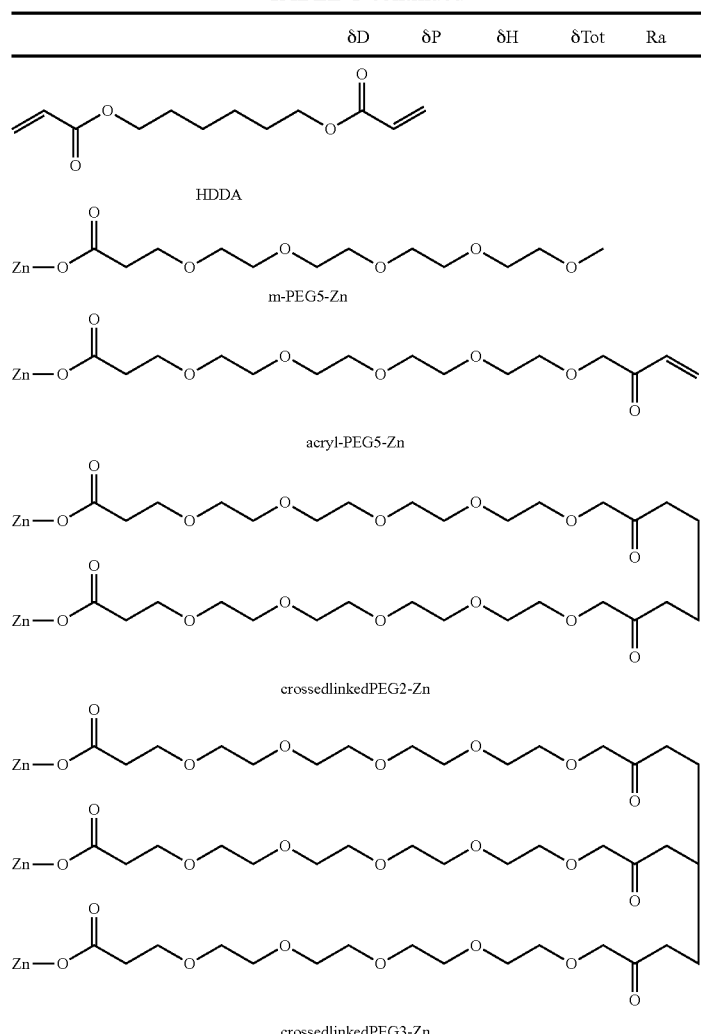

As shown in Table 1 above, the Ra value of acryl-PEG5-Zn including an acrylic group is higher than that of m-PEG5-Zn not including an acrylic group. Furthermore, when a crosslinked group is included, solubility in HDDA further decreases which is observed by an increased Ra value.

Therefore, when the surface of the quantum dot is covered with crosslinked Zn-PEG, it is expected that a quantum dot having high compatibility may be manufactured due to low solubility and high dispersity obtained by the crosslinked Zn-PEG.

According to embodiments of the present disclosure, not only dispersity of the quantum dot in a polar solvent may be increased without detachment of a non-polar ligand by introducing a coating layer including the polar ligand into the quantum dot surface-coordinated with the non-polar ligand, but also efficiency of the quantum dot may be increased by inhibiting or reducing loss of the semiconductor metal from the non-polar ligand and the quantum dot by introducing the coating layer.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims, and equivalents thereof.

What is claimed is:

1. A quantum dot comprising:
    a core comprising crystals of a first semiconductor;
    a shell located on the core and comprising crystals of at least one second semiconductor;
    a first region located on the shell and comprising a first ligand; and
    an outerlayer located on the first region and comprising an oligomer and/or polymer including a metal and a polar organic group.

2. The quantum dot of claim 1, wherein the metal comprises at least one selected from the group consisting of Cd, Zn, Hg, Mg, Ga, Al, In, Sn, Pb, Si, Ge, Ag, Cu, and a combination thereof.

3. The quantum dot of claim 1, wherein the metal comprises a same metal as that included in the crystals of the second semiconductor.

4. The quantum dot of claim 1, wherein the polar organic group comprises at least one selected from the group consisting of a hydroxyl group, a carbonyl group, an acryl group, an ester group, an ether group, a carboxyl group, an epoxy group, a halogen group, and a combination thereof.

5. The quantum dot of claim 1, wherein the oligomer and/or the polymer comprises a polymerization product of a monomer represented by Formula 1 below:

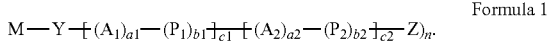

Formula 1 wherein in Formula 1,

M comprises at least one selected from the group consisting of Cd, Zn, Hg, Mg, Ga, Al, In, Sn, Pb, Si, Ge, Ag, Cu, and a combination thereof, Y is an ionic group, $A_1$ and $A_2$ are each independently selected from a $C_1$-$C_{20}$ alkylene group unsubstituted or substituted with at least one $R_{10a}$ and a $C_2$-$C_{20}$ alkenylene group unsubstituted or substituted with at least one $R_{10a}$, a1 and a2 are each independently an integer selected from 0 to 10, when a1 is an integer of 2 or more, 2 or more $A_1$s are same or different, and when a2 is an integer of 2 or more, 2 or more $A_2$s are same or different, $P_1$ and $P_2$ are each independently selected from *—O—*', *—S—*', *—C(=O)—*', *—S(=O)$_2$—*', *—C(=O)O—*', *—C($R_1$)=C($R_2$)—C(=O)O$R_3$—*', *—O—C(=O)—C($R_1$)=C($R_2$)—*', and *—C($R_1$)($R_2$)—*', b1 and b2 are each independently an integer selected from 1 to 10, when b1 is an integer of 2 or more, 2 or more $P_1$s are same or different, and when b2 is an integer of 2 or more, 2 or more $P_2$s are same or different, c1 and c2 are an integer selected from 0 to 10, when c1 is an integer of 2 or more, 2 or more *-$(A_1)_{a1}$-$(P_1)_{b1}$—*' are the same or different, and when c2 is an integer of 2 or more, 2 or more *-$(A_2)_{a2}$-$(P_2)_{b2}$—*' are the same or different, $R_1$ to $R_3$ are each independently selected from hydrogen, a hydroxyl group, an alkoxy group, an epoxy group, and a halogen group, $R_{10a}$ is selected from hydrogen, a $C_1$-$C_{20}$ alkyl group, and a $C_2$-$C_{20}$ alkenyl group, n is an integer selected from 1 to 5, when n is an integer of 2 or more, 2 or more

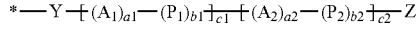

are the same or different, and

Z is a crosslinkable group including at least one selected from an ethylenically unsaturated group, an epoxy group, an alkoxy group, and an isocyanate group.

6. The quantum dot of claim 5, wherein the ionic group is at least one selected from the group consisting of a thiol group, a carboxyl group, an amine group, a phosphate group, a sulfate group, and a nitrate group.

7. The quantum dot of claim 5, wherein the polymer comprises a crosslinked polymer produced by crosslinking of the crosslinkable group by light, heat, and/or a crosslinking group.

8. The quantum dot of claim 1, wherein the first ligand comprises a $C_1$-$C_{20}$ hydrocarbon group.

9. The quantum dot of claim 8, wherein the first ligand further comprises an ionic group.

10. The quantum dot of claim 1, wherein the first ligand binds to the shell via a coordinate covalent bond.

11. The quantum dot of claim 1, wherein the first semiconductor and the second semiconductor each independently comprise at least one selected from the group consisting of a Group II-VI semiconductor compound; a Group III-V semiconductor compound; a group III-VI semiconductor compound; a Group I-III-VI semiconductor compound; a Group IV-VI semiconductor compound; a Group IV element or compound; and a combination thereof.

12. The quantum dot of claim 1, wherein the first semiconductor and the second semiconductor each independently comprise at least one selected from the group consisting of:

CdS, CdSe, CdTe, ZnS, ZnSe, ZnTe, ZnO, HgS, HgSe, HgTe, MgSe, MgS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, CdZnSeS, CdZnSeTe, CdZnSTe, CdHgSeS, CdHgSeTe, CdHgSTe, HgZnSeS, HgZnSeTe, and HgZnSTe;

GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, InGaZnP, and InAlZnP;

GaS, GaSe, $Ga_2Se_3$, GaTe, InS, InSe, $In_2Se_3$, InTe, InGaSs, and $InGaSe_3$, AgInS, $AgInS_2$, CuInS, $CuInS_2$, $CuGaO_2$, $AgGaO_2$, and $AgAlO_2$;

SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, SnPbSTe, Si, Ge, SiC, and SiGe;

and a combination thereof.

13. The quantum dot of claim 1, wherein the first semiconductor comprises at least one selected from the group consisting of GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, InZnP, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof, and the second semiconductor comprises at least one selected from the group consisting of CdS, CdSe, CdTe, ZnS, ZnSe, ZnTe, ZnO, HgS, HgSe, HgTe, MgS, MgSe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnS, MgZnSe, CdZnSeS, CdZnSeTe, CdZnSTe, CdHgSeS, CdHgSeTe, CdHgSTe, HgZnSeS, HgZnSeTe, HgZnSTe, and a combination thereof.

14. The quantum dot of claim 1, wherein the shell is a double-layered shell comprising a first shell and a second shell, wherein the first shell is interposed between the core and the second shell.

15. The quantum dot of claim 14, wherein the first shell and the second shell comprise crystals of different second semiconductors.

16. An ink composition comprising the quantum dot according to claim 1.

17. An optical member comprising the quantum dot according to claim 1.

18. The optical member of claim 17, wherein the optical member is a color conversion member.

19. An electronic device comprising:
- a first electrode;
- a second electrode facing the first electrode;
- an intermediate layer interposed between the first electrode and the second electrode, and
- a color conversion member provided to an exterior of one or more selected from the first electrode and the second electrode facing the intermediate layer,
- wherein the color conversion member comprises the quantum dot according to claim 1.

20. The electronic device of claim 19, further comprising a thin film transistor,
- wherein the thin film transistor comprises a source electrode and a drain electrode,
- wherein the first electrode of the electronic device is electrically connected to at least one selected from the source electrode and the drain electrode of the thin film transistor.

* * * * *